United States Patent
Miyagi et al.

(10) Patent No.: US 9,063,429 B2
(45) Date of Patent: Jun. 23, 2015

(54) NEGATIVE DEVELOPING METHOD AND NEGATIVE DEVELOPING APPARATUS

(71) Applicant: SOKUDO CO., LTD., Kyoto (JP)

(72) Inventors: Tadashi Miyagi, Kyoto (JP); Tsuyoshi Mitsuhashi, Kyoto (JP); Takehiro Wajiki, Kyoto (JP)

(73) Assignee: SCREEN Semiconductor Solutions Co., Ltd. (JP)

( * ) Notice: Subject to any disclaimer, the term of this patent is extended or adjusted under 35 U.S.C. 154(b) by 0 days.

(21) Appl. No.: 14/142,048

(22) Filed: Dec. 27, 2013

(65) Prior Publication Data

US 2014/0199638 A1   Jul. 17, 2014

(30) Foreign Application Priority Data

Jan. 11, 2013 (JP) ................................ 2013-003641

(51) Int. Cl.
*G03F 7/40* (2006.01)

(52) U.S. Cl.
CPC ........................................ *G03F 7/40* (2013.01)

(58) Field of Classification Search
CPC ..... G03F 7/325; G03F 7/0392; G03F 7/2041; G03F 7/40; G03F 7/0382; G03F 7/2024; G03F 7/32; G03F 7/2002; G03F 7/20; G03F 7/38; G03F 7/30; G03F 7/3021; H01L 21/0274; H01L 21/0271; H01L 21/31144; H01L 21/027; H01L 21/0273
USPC .................................................... 430/331, 322
See application file for complete search history.

(56) References Cited

U.S. PATENT DOCUMENTS

2002/0170574 A1* 11/2002 Quarantello ...................... 134/6
2008/0090185 A1 4/2008 Harumoto et al. ............ 430/432

FOREIGN PATENT DOCUMENTS

JP    2008-091751    4/2008
JP    2011-028281    2/2011

* cited by examiner

*Primary Examiner* — Caleen Sullivan
(74) *Attorney, Agent, or Firm* — Ostrolenk Faber LLP

(57) ABSTRACT

After a developing step, a substrate is spun at high speeds without supplying a cleaning liquid to a surface of the substrate. This causes a large centrifugal force to act on a developer on a resist film. Consequently, the developer can be removed rapidly from the surface of the substrate. As a result, development can be stopped at an expected timing. Moreover, a circuit pattern having an expected dimension can be obtained. At this time, a dissolved product is also removable with the developer from the substrate. This can avoid failure in development caused by the dissolved product. Consequently, suitably maintained quality of negative development can be achieved with a reduced usage amount of the cleaning liquid.

12 Claims, 6 Drawing Sheets

NEGATIVE DEVELOPING METHOD AND NEGATIVE DEVELOPING APPARATUS

CROSS REFERENCE TO RELATED APPLICATIONS

This application claims priority to Japanese Patent Application No. 2013-003641 filed on Jan. 11, 2013, the entire contents of which are incorporated by reference herein.

TECHNICAL FIELD

The present invention relates to a negative developing method and a negative developing apparatus to develop a semiconductor wafer, a glass substrate for a photomask, a glass substrate for a liquid crystal display, a substrate for an optical disk (hereinafter simply called a substrate) with a developer containing an organic solvent.

BACKGROUND ART

In a process of manufacturing a semiconductor device, a circuit pattern is formed on a resist film on a substrate with the use of lithography. The circuit pattern is formed through a series of processes. Specifically, a photoresist is applied to a surface of a substrate, a circuit pattern is baked on a resist film on the surface of the substrate with an exposing machine, and then a developer is supplied to the exposed resist film to perform a developing process. In the developing process of these, a developing method with puddle development has been used widely. The puddle development is a developing method performed in a state where a substrate is spun around a vertical axis while being held horizontally and a developer is supplied from a tip outlet of a straight nozzle to the center of the substrate to coat the resist film on the entire surface of the substrate with the developer filmily. The circuit pattern formed on the resist film has a line width adjusted in accordance with a developing time. The resist film is coated with the developer for a given time to form an expected circuit pattern. Thereafter, a cleaning liquid is supplied to the substrate to perform cleaning. When the cleaning is finished, the substrate is spun to be dried through a spin-dry effect (as disclosed in Japanese Unexamined Patent Publication No. 2008-91751A, page 3, for example).

A positive developing method (also called positive development) using an alkaline developer such as a TMAH (Tetra Methyl Ammonium Hydroxide) solution has been conventionally used. Instead of this method, a negative developing method (also called negative development) using a developer containing an organic solvent such as butyl acetate has been used recently. In the positive developing method, deionized water is used as a cleaning liquid whereas, in the negative developing method, a cleaning liquid containing an organic solvent such as MIBC (Methyl Iso Butyl Carbinol) is used (as disclosed in Japanese Unexamined Patent Publication No. 2011-28281A, page 79, for example).

The negative developing method with a conventional configuration has the following problem.

Since an organic solvent is more expensive than deionized water, a usage amount of the cleaning liquid greatly influences costs for the negative developing method. This may cause an inconvenience.

On the other hand, when the usage amount of the cleaning liquid is decreased, the developing quality may be reduced accordingly. Firstly, components in the resist film are dissolved into the developer to obtain a dissolved product. The dissolved product easily remains on the substrate also after cleaning. This may cause failure in the development. Secondly, since the developer easily remain on the substrate also after the cleaning, it becomes difficult to stop the development at an appropriate timing. This may cause difficulty in suitably control of a line width in the circuit pattern.

SUMMARY OF INVENTION

The present invention has been made regarding the state of the art noted above, and its one object is to provide a negative developing method and a negative developing apparatus that allow maintained development quality with a reduced usage amount of a cleaning liquid.

The above object is fulfilled, according to this invention, by a negative developing method including:

a developing step of performing development by supplying a developer containing an organic solvent onto a resist film formed on a surface of a substrate and coating the resist film with the supplied developer;

a surface drying step of drying the surface of the substrate by spinning the substrate at a first speed after the developing step;

a rear face cleaning step of cleaning a rear face of the substrate by supplying a cleaning liquid only to the rear face of the substrate and spinning the substrate at a second speed lower than the first speed after the surface drying step; and a rear face drying step of drying the rear face of the substrate by spinning the substrate after the rear face cleaning step.

According to the negative developing method of the present invention, the substrate is spun at the first speed in the surface drying step, the first speed being relatively higher. Spinning at higher speeds causes a relatively large centrifugal force to act on the developer on the resist film. Consequently, the developer can be removed from the surface of the substrate without supplying the cleaning liquid to the substrate. As a result, the development can be stopped at an appropriate timing. In addition, since the developer contains an organic solvent, the dissolved product in the developer can be removed together with the developer from the surface of the substrate by the centrifugal force. Thereafter, the surface of the substrate is dried. Accordingly, a residual dissolved product can be prevented from remaining on the dried surface of the substrate. This allows suppressing failure in the development caused by the dissolved product.

In the rear face cleaning step, the substrate is spun at the second speed, the second speed being relatively low. Consequently, the cleaning liquid supplied to the rear face of the substrate can be prevented from scattering around the substrate, and thus allows expanding only on the rear face of the substrate suitably. As a result, in the rear face cleaning step, the rear face of the substrate can be cleaned suitably while the dried surface of the substrate is kept clean.

As noted above, the use of the cleaning liquid only on the rear face of the substrate allows a suppressed usage amount of the cleaning liquid. In addition, the relatively-high spinning speed of the substrate in the surface drying step and the relatively-low spinning speed of the substrate in the rear face cleaning step can achieve suitably maintained quality of the negative development.

According to the negative developing method of the present invention, the developing step is performed, and thereafter the surface drying process is performed without supplying the cleaning liquid to the substrate. In the surface drying process, removal of the developer and the dissolved product as well as drying of the surface of the substrate is performed at one stroke. Accordingly, reduction in consumption of the cleaning liquid, control of proceeding of the developing step with high accuracy, and avoidance of the residual dissolved product on the dried substrate can be performed at one stroke. That is, a usage amount of the cleaning liquid can be reduced with the maintained development quality.

Moreover, the negative developing method of the present invention further includes:

a developing step of performing development by supplying a developer containing an organic solvent to the resist film on the surface of the substrate to cover the resist film with the supplied developer; and a surface drying step of spinning the substrate at the first speed and removing the developer on the resist film using a centrifugal force after the developing step, thereby drying the surface of the substrate while stopping the development.

According to the negative developing method of the present invention, the substrate is spun at the relatively-high first speed in the surface drying step. Such spinning at high speeds causes the centrifugal force to act on the developer on the resist film. This allows the developer to be removed suitably from the surface of the substrate without supplying the cleaning liquid to the substrate. Consequently, the development can be stopped at an appropriate timing. Moreover, since the developer contains an organic solvent, the dissolved product can be removed together with the developer from the surface of the substrate with the centrifugal force. Thereafter, the surface of the substrate is dried. Consequently, the residual dissolved product on the surface of the substrate can be suppressed. As noted above, the development quality can be maintained.

In the example above of this invention, the first speed is preferably from 1500 rpm to 2500 rpm. In this case, a sufficiently large centrifugal force allows the developer to be removed from the surface of the substrate. As a result, proceeding of the development can be stopped rapidly after the surface drying step commences. That is, the line width of the circuit pattern can be controlled with high accuracy.

It is preferable that the above embodiment of the present invention further includes a rear face cleaning step. In the rear face cleaning step, the rear face is cleaned by supplying the cleaning liquid only to the rear face of the substrate and spinning the substrate at a second speed lower than the first speed after the surface drying step. In this step, the cleaning liquid is supplied only to the rear face of the substrate. Consequently, a significantly reduced usage amount of the cleaning liquid can be achieved. Moreover, spinning the substrate at low speeds allows suppressing airborne splashes or particles of the cleaning liquid around the substrate after the rear face cleaning step commences. Accordingly, the splashes of the cleaning liquid can be prevented from adhering on the surface of the substrate, avoiding reduction in quality of the development.

It is preferable that in the above embodiment of the present invention, the rear face of the substrate is dried by spinning the substrate at a third speed higher than the second speed in the rear face drying step. In this step, the rear face of the substrate can be dried immediately. Consequently, a time for a series of processes concerning the negative development can be shortened.

Another aspect of the present invention discloses a negative developing apparatus. The negative developing apparatus includes:

a substrate holder configured to hold a substrate horizontally;

a substrate spinning section configured to spin the substrate held horizontally with the substrate holder;

a developer supplying section configured to supply a developer containing an organic solvent to a surface of the substrate held with the substrate holder;

a cleaning liquid supplying section configured to supply a cleaning liquid only to a rear face of the substrate; and a controller configured to control the substrate spinning section, the developer supplying section and the cleaning liquid supplying section so as to perform a developing step, a surface-drying step, a rear-face cleaning step and a rear-face drying step, in the developing step development being performed by supplying the developer from the developer supplying section to the surface of the substrate to coat a resist film on the surface of the substrate with the developer, in the surface drying step the surface of the substrate being performed by spinning the substrate at a first speed, in the rear face cleaning step the rear face of the substrate being cleaned by supplying the cleaning liquid from the cleaning liquid supplying section and spinning the substrate at a second speed lower than the first speed, and in the rear-face drying step the rear face of the substrate being dried by spinning the substrate.

According to the negative developing apparatus of the present invention, the substrate spinning section spins the substrate at the relatively-high first speed in the surface drying step. Spinning at high speeds causes a relatively large centrifugal force to act on the developer on the resist film. This achieves suitable removal of the developer from substrate without supplying the cleaning liquid to the surface of the substrate. Consequently, the developing step can be stopped at an appropriate timing. Moreover, since the developer contains an organic solvent, the dissolved product can be removed together with the developer from the surface of the substrate with the centrifugal force. Thereafter, the surface of the substrate is dried. That is, a residual dissolved product can be prevented from remaining on the dried surface of the substrate. This allows suppressing failure of the development caused by the dissolved product.

In the rear face cleaning step, the substrate spinning section spins the substrate at the relatively-low second speed. This achieves suppression of scattering the cleaning liquid supplied to the rear face of the substrate around the substrate. This also allows the cleaning liquid to expand suitably on the rear face of the substrate. As a result, the rear face cleaning step achieves cleaning the rear face of the substrate suitably while the dried surface of the substrate is kept clean.

As noted above, the use of the cleaning liquid only to the rear face of the substrate achieves a suppressed usage amount of the cleaning liquid. In addition, the relatively-high spinning speed of the substrate in the surface drying step and the relatively-low spinning speed of the substrate in the rear face cleaning step can achieve the suitably maintained quality of the negative development.

According to the negative developing method of the present invention, the developing step is performed, and thereafter the surface drying step is performed without supplying the cleaning liquid to the substrate. The surface drying step performs removal of the developer and the dissolved product and drying of the substrate surface at one stroke. As a result, reduction in consumption of the cleaning liquid, control of proceeding of the development with high accuracy, and avoidance of a residual dissolved product on the dried substrate can be performed at one stroke. That is, the usage amount of the cleaning liquid can be reduced with the maintained development quality.

Another aspect of the present invention discloses a negative developing apparatus. The negative developing apparatus includes:

a substrate holder configured to hold a substrate horizontally;

a substrate spinning section configured to spin the substrate held horizontally with the substrate holder;

a developer supplying section configured to supply a developer containing an organic solvent to a surface of the substrate held with the substrate holder; and a controller configured to control the substrate spinning section and the developer supplying section so as to supply the developer from the developer supplying section and cover the resist film formed on the surface of the substrate with the developer to perform a developing step, and thereafter to dry the surface of the substrate while the developing step is stopped by spinning the substrate at a first speed to remove the developer on the resist film with a centrifugal force.

According to the negative developing apparatus of the present invention, the substrate spinning section spins the substrate at the relatively-high first speed in the surface drying step. Then a relatively-large centrifugal force acts on the developer on the resist film. This achieves removal of the developer from the substrate without supplying the cleaning liquid to the surface of the substrate. Consequently, the developing step can be stopped at an appropriate timing. Moreover, since the developer contains an organic solvent, the dissolved product can be removed together with the developer from the surface of the substrate with the centrifugal force. Thereafter, the surface of the substrate is dried. That is, the residual dissolved product can be prevented from remaining on the dried surface of the substrate. As noted above, the maintained development quality can be maintained with a suppressed usage amount of the cleaning liquid.

In the example above of this invention, the first speed is preferably from 1500 rpm to 2500 rpm. In this case, a sufficiently large centrifugal force allows the developer to be removed from the surface of the substrate. As a result, proceeding of the development can be stopped rapidly after the surface drying step commences. That is, the line width of the circuit pattern can be controlled with high accuracy.

It is preferable that the above aspect of the present invention further includes a cleaning liquid supplying section configured to supply a cleaning liquid only to a rear face of the substrate, and that the controller controls the cleaning liquid supplying section so as to supply the cleaning liquid after the surface drying step and controls the substrate spinning section so as clean the rear face of the substrate by spinning the substrate at a second speed lower than the first speed. In this step, the cleaning liquid is supplied only to the rear face of the substrate. Consequently, a significantly reduced usage amount of the cleaning liquid can be achieved. Moreover, spinning the substrate at low speeds allows suppressing airborne splashes or particles of the cleaning liquid around the substrate after the rear face cleaning step commences. Accordingly, the splashes of the cleaning liquid can be prevented from adhering on the surface of the substrate, avoiding reduction in quality of the development.

The controller in the above aspect of the present invention preferably controls the substrate spinning section so as to dry the rear face of the substrate by spinning the substrate at a third speed higher than the second speed in the rear face drying step. In this step, the rear face of the substrate can be dried immediately. Consequently, a time for a series of processes concerning the negative development can be shortened.

BRIEF DESCRIPTION OF DRAWINGS

For the purpose of illustrating the invention, there are shown in the drawings several forms which are presently preferred, it being understood, however, that the invention is not limited to the precise arrangement and instrumentalities shown.

DESCRIPTION OF EMBODIMENTS

Description will be given hereinafter in detail of a preferable embodiment of the present invention with reference to drawings.

Figure 1:
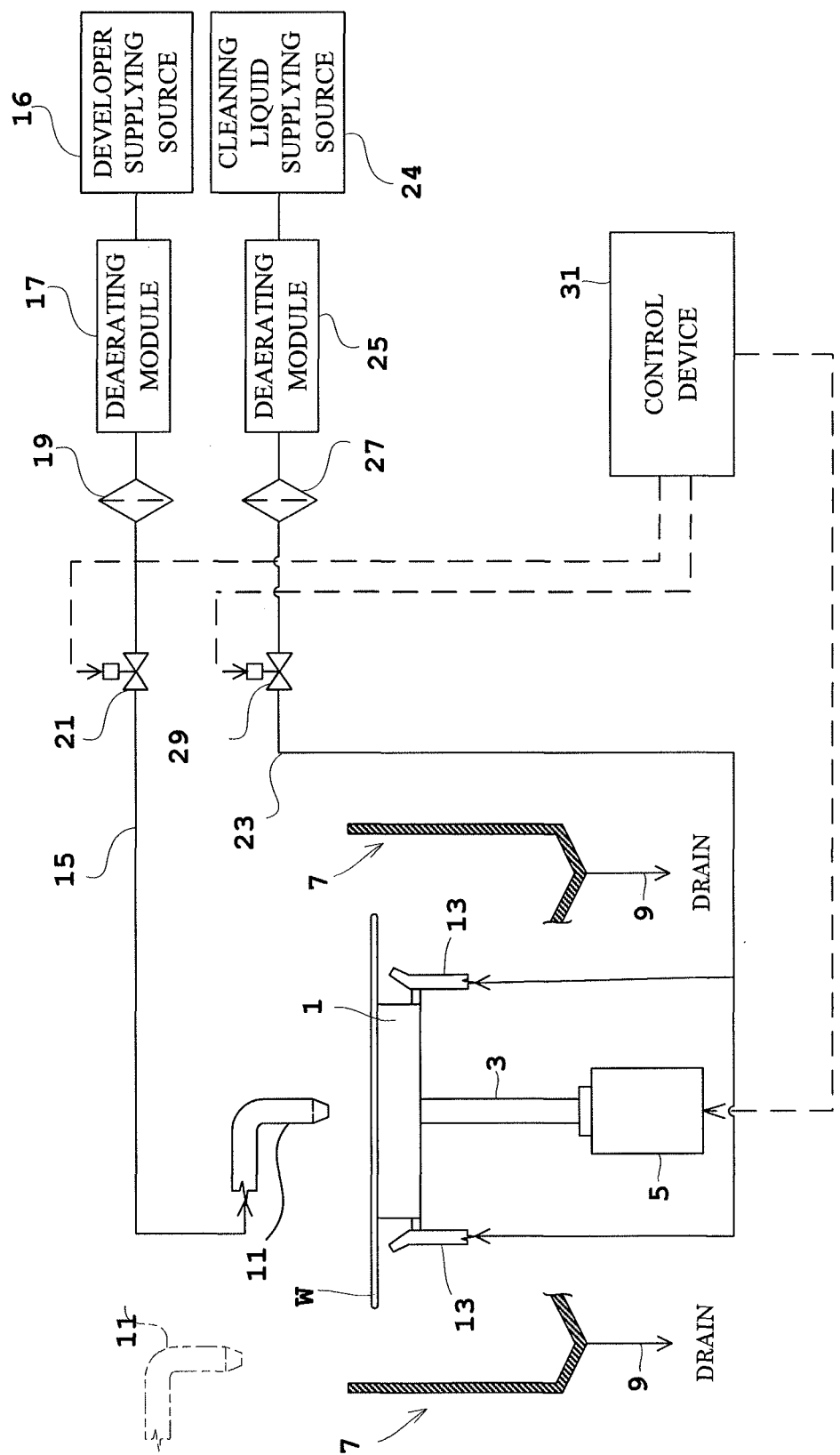
FIG. 1 is a longitudinal sectional view schematically illustrating a negative developing apparatus according to one embodiment of the present invention.

FIG. 1 is a longitudinal sectional view schematically illustrating a negative developing apparatus according to one embodiment of the present invention.

A negative developing apparatus according to one embodiment of the present invention includes a spin chuck 1 configured to move upward and downward. The spin chuck 1 holds a substrate W horizontally. A lower part of the spin chuck 1 is connected to a rotary shaft 3. A rotary motor 5 is disposed on a lower part of the rotary shaft 3. The rotary motor 5 spins the spin chuck 1 and the rotary shaft 3 about a vertical axis. A scatter preventive cup 7 is disposed around the spin chuck 1. The spin chuck 1 may be fixed and the scatter preventive cup 7 may move upward and downward. Here, the spin chuck 1 corresponds to a substrate holder in the present invention. The rotary motor 5 corresponds to a substrate spinning section in the present invention.

A drain tube 9 is in communication with a bottom of the scatter preventive cup 7. A developer supplying nozzle 11 is arranged adjacent to the scatter preventive cup 7. The developer supplying nozzle 11 supplies a developer to a surface of the substrate W. The developer supplying nozzle 11 is, for example a straight nozzle having an outlet formed on a tip end thereof. The developer supplying nozzle 11 moves between a supply position (by solid lines in drawings) over the spin chuck 1 and a standby position (by chain double-dashed lines in drawings) away from over the scatter preventive cup 7. When the developer supplying nozzle 11 is moved to the supply position, the outlet of the developer supplying nozzle 11 is located immediately above the center of the substrate W. The standby position of the developer supplying nozzle 11 is not limited to a position away from over the scatter preventive cup 7, and thus may be modified appropriately. For instance, the developer supplying nozzle 11 may be located over the scatter preventive cup 7. The developer supplying nozzle 11 corresponds to a developer supplying section in the present invention.

A cleaning liquid supplying nozzle 13 is arranged around a lower portion of the spin chuck 1. The cleaning liquid supplying nozzle 13 supplies a cleaning liquid to the rear face of the substrate W. The cleaning liquid supplying nozzle 13 is, for example, a straight nozzle having an outlet at a tip end thereof. The cleaning liquid supplying nozzle 13 corresponds to a cleaning liquid supplying section in the present invention.

The developer supplying nozzle 11 is in fluid communication with a developer supplying source 16 via a developer supplying pipe 15 into which a deaerating module 17, a filter 19, and a switch control valve 21 are inserted. The developer supplying source 16 stores the developer containing an organic solvent. The developer is fed to the developer supplying nozzle 11 with pressure of inactive gas. Examples of the organic solvent in the developer include butyl acetate. The deaerating module 17 deaerates the developer to be fed. The developer through the developer supplying nozzle 11 is supplied and stopped in accordance with switching on and off of the switch control valve 21.

The cleaning liquid supplying nozzle 13 is in fluid communication with a cleaning liquid supplying source 24 via a cleaning liquid supplying pipe 23 into which a cleaning liquid supplying pipe 23, a deaerating module 25, a filter 27, and a switch control valve 29 are inserted. The cleaning liquid supplying source 24 stores a cleaning liquid containing an organic solvent. The cleaning liquid is fed to the cleaning liquid supplying nozzle 13 with pressure of inactive gas. Examples of the organic solvent in the cleaning liquid include MIBC. The deaerating module 25 deaerates the developer to be fed. The developer through the developer supplying nozzle 13 is supplied and stopped in accordance with switching on and off of the switch control valve 29.

A control device 31 controls en bloc upward and downward movement of the spin chuck 1, spinning of the rotary motor 5, movement of the developer supplying nozzle 11, feeding of the developer in the developer supplying source 16, driving of the deaerating modules 17, 25, switching on and off of the switch control valves 21, 29, and feeding of the cleaning liquid in the cleaning liquid supplying source 24. The control device 31 corresponds to a controller in the present invention.

Figure 2:
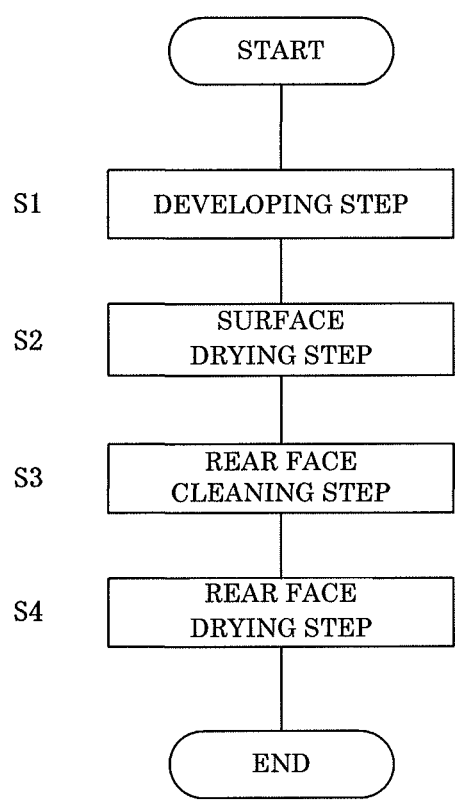
FIG. 2 is a flow chart of operations according to the embodiment.
Figure 3:
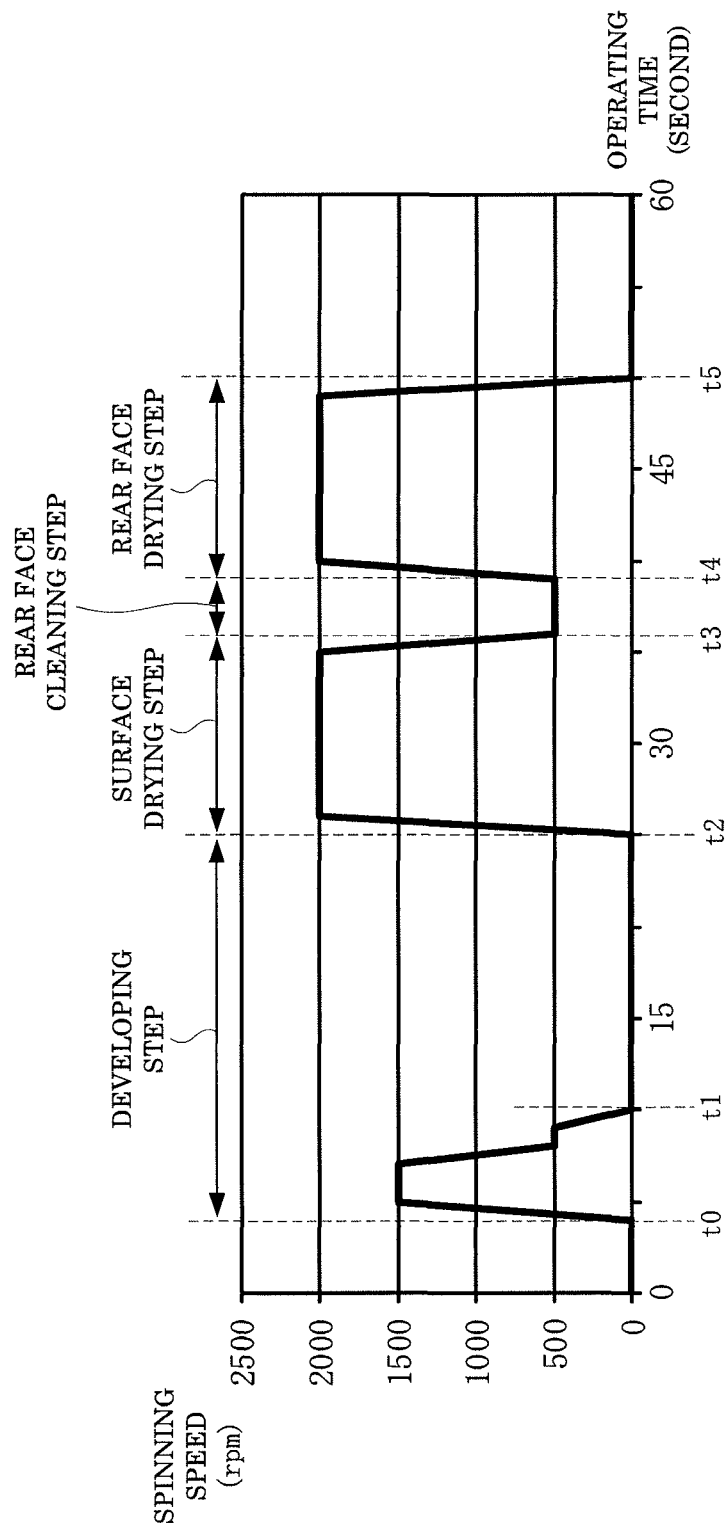
FIG. 3 is a graph illustrating a relationship between an operation time and a spinning speed of a substrate according to the embodiment.

Description will be given next of operations of the negative developing apparatus mentioned above with reference to FIGS. 2 and 3. FIG. 2 is a flow chart of operations according to the embodiment. FIG. 3 is a graph illustrating a relationship between an operation time and a spinning speed of the substrate according to the embodiment. In the following description, it is assumed that an exposed substrate W having the resist film applied thereto is already held with the spin chuck 1, and the developer supplying nozzle 11 is moved to the supply position.

Step S1 (Developing Step)

At time t0 in FIG. 3, the control device 31 controls the rotary motor 5, the developer supplying source 16, the deaerating module 17, and the switch control valve 21 to spin the horizontally-held substrate W at a given speed and to start supplying the developer containing an organic solvent from the developer supplying nozzle 11 to the center of the surface of the substrate W. The given speed is, for example, 1500 rpm. The control device 31 performs control so as to spin the substrate W and supply the developer for a period from time t0 to time t1. The developer supplied to the substrate W expands over the surface of the substrate W so as to cover the resist film formed on the surface of the substrate W. The period from time t0 to time t1 is, for example, 5 seconds.

At time t1, the control device 31 performs control so as to stop supplying the developer onto the substrate W and to stop spinning the substrate W. Then, the developer eject nozzle 11 is moved to a standby position. At this time, the developer is coated on the resist film. Such development proceeds for a period from time t1 to time t2 with this state maintained. The period from time t1 to time t2 is, for example, fifteen seconds. An unexposed portion of the resist film is dissolved by the developer during the developing step, thereby being a dissolved product. The developing step is completed at time t2. A step during the period from time t0 to time t2 corresponds to the developing step in the present invention.

Step S2 (Surface Drying Step)

The surface drying step starts simultaneously with completion of the developing step. Specifically, the control device 31 performs control to start spinning the substrate W at the first speed at time t2. In the surface drying step, no cleaning liquid is supplied to the substrate W. The first speed is, for example, 2000 rpm. The relatively-high first speed causes a relatively-large centrifugal force. Consequently, the developer on the substrate W is scattered out of the substrate W with the centrifugal force, and thus is immediately removed from the surface of the substrate W. At this time, the dissolved product is also removed together with the developer from the surface of the substrate W. The developer and the dissolved product are removed in this way. Thereafter, the surface of the substrate W is dried rapidly.

The control device 31 continues control so as to spin the substrate W at the first speed for a period from time t2 to time t3, whereby the surface drying step is performed. The period from time t2 to time t3 is, for example, ten seconds. The surface drying step is completed at time t3. A step during the period from time t2 to time t3 corresponds to the surface drying step in the present invention.

Step S3 (Rear Face Cleaning Step)

The rear face cleaning step starts simultaneously with completion of the surface drying step. Specifically, the control device 31 performs control so as to switch the spinning speed of the substrate W from the first speed to the second speed at time t3. The second speed is lower than the first speed. The second speed is, for example, 500 rpm. Immediately after switching the spinning speed of the substrate W, the control device 31 starts supplying the cleaning liquid to the rear face of the substrate W from the cleaning liquid supply nozzle 13. Since the second speed is relatively low, the cleaning liquid supplied to the rear face of the substrate W expands only on the rear face of the substrate suitably without scattering around the substrate. Consequently, atmosphere on the surface of the substrate W is kept clean while impurities such as dusts on the rear face of the substrate W are removed with the cleaning liquid.

The control device 31 performs control so as to continue supplying the cleaning liquid for a period of time t3 to time t4 to perform the rear face cleaning step mentioned above. The period from time t3 to time t4 is, for example, five seconds. Thereafter, the control device 31 performs control so as to stop supplying the cleaning liquid at time t4, thereby completing the rear face cleaning step. A step during the period from time t3 to time t4 corresponds to the rear face cleaning step in the present invention.

Step S4 (Rear Face Drying Step)

The rear face drying step starts simultaneously with completion of the rear face cleaning step. Specifically, the control device 31 performs control so as to switch the spinning speed of the substrate W from the second speed to the third speed, thereby starting the rear face drying step. The third speed is higher than the second speed, and is for example 2000 rpm. The rear face of the substrate W can be dried rapidly with a spin-dry effect. The control device 31 performs control so as to spin the substrate W at the third speed for a period from time t4 to time t5. The period from time t4 to time t5 is, for example, ten seconds. Thereafter, the control device 31 performs control so as to stop spinning the substrate W at time t5, thereby completing the rear face drying step. A step during the period from time t4 to time t5 corresponds to the rear face drying step in the present invention.

As noted above, the negative developing apparatus according to the embodiment of the present invention omits cleaning of the surface of the substrate W with the cleaning liquid. Consequently, effective reduction in usage amount of the cleaning liquid can be achieved. In addition, in the surface drying step, the substrate W is spun at the first speed. This achieves removal of the developer on the substrate W immediately and stopping the development rapidly. Accordingly, controlling a timing of starting the surface drying step allows a developing time to be controlled with high accuracy. That is, the line width of the circuit pattern can be controlled with high accuracy.

Moreover, the surface drying step can achieve removal of the developer (stopping development), removal of the dissolved product (prevention of failure in the development), and drying of the surface of the substrate W at one stroke. Consequently, a time for a series of processes can be shortened.

Moreover, in the rear face cleaning step, the rear face of the substrate W is cleaned with the cleaning liquid. This allows suitable cleaning of the rear face of the substrate W. The cleaning liquid is supplied to the rear face of the substrate W only, achieving effective reduction in usage amount of the cleaning liquid. Furthermore, since the cleaning liquid contains an organic solvent, the substrate W after the negative developing step can be cleaned suitably.

In addition, in the rear face cleaning step, the substrate W is spun at the second speed. This makes it difficult to generate splashes or mist of the cleaning liquid. Even if a splash or mist is generated, it is difficult for it to be airborne around the substrate. Consequently, atmosphere on the surface of the substrate W can be kept clean. As a result, further adhesion of splashes, mist, or dust on the surface of the substrate W can be avoided. This eliminates reduction in quality of processing the substrate W.

Moreover, in the rear face drying step, the substrate W is spun at the third speed. This achieves rapid drying of the rear face of the substrate W. Consequently, a further shortened time for a series of the negative development can be achieved.

Figure 4:
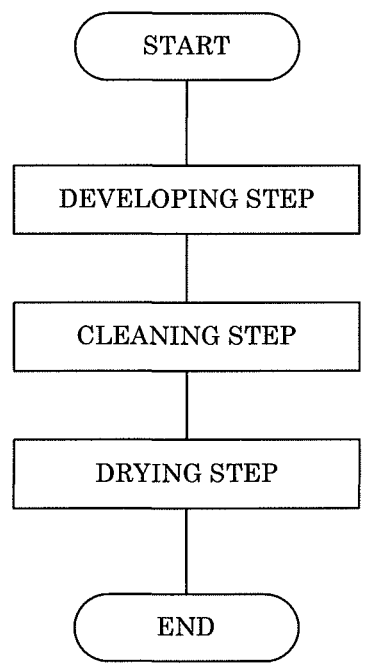
FIG. 4 is a flow chart of operations according to one comparative example.
Figure 5:
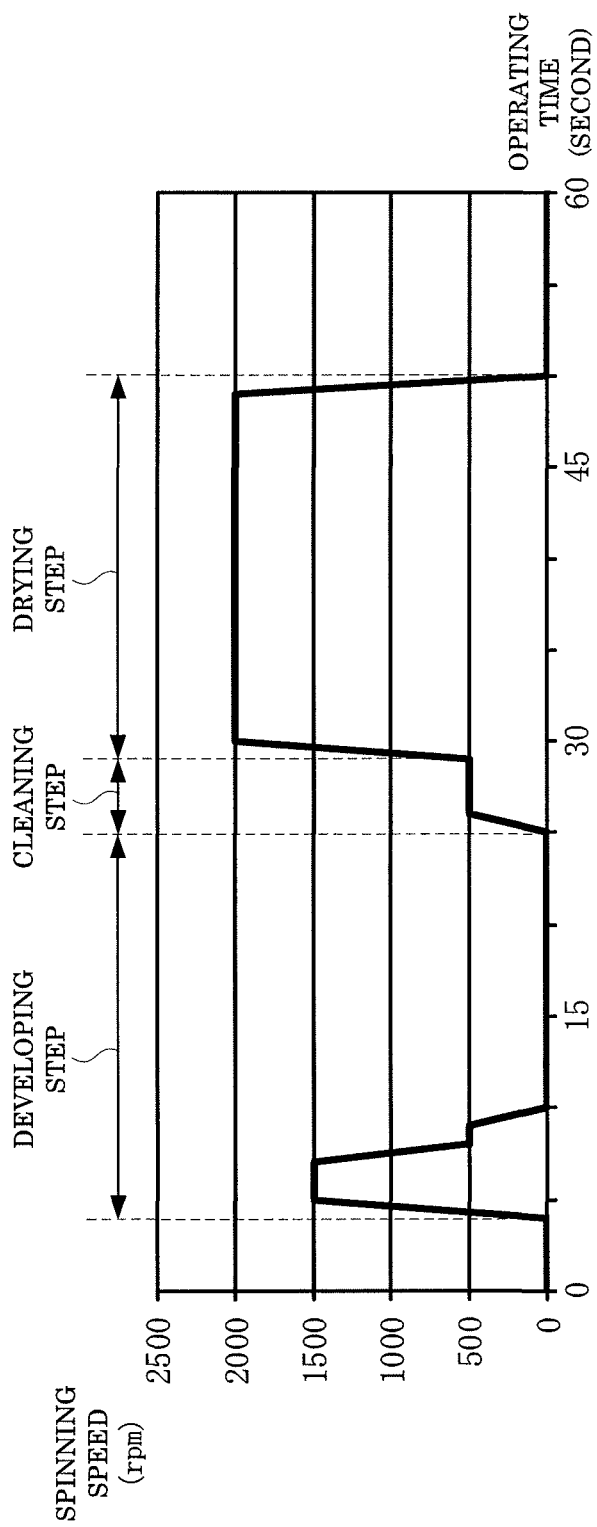
FIG. 5 is a graph illustrating a relationship between an operation time and a spinning speed of a substrate according to the comparative example.

Comparison of the negative developing method is made next between the embodiment and a comparative example. FIG. 4 is a flow chart of development according to one comparative example. FIG. 5 is a graph illustrating a relationship between an operation time and a spinning speed of a substrate according to the comparative example.

As illustrated in FIG. 4, negative development proceeds by performing three steps. i.e., a developing step, a cleaning step, and a drying step, in this order. In the cleaning step, the surface and the rear face of the substrate W are each cleaned. In the drying step, the surface and the rear face of the substrate W are cleaned at one stroke.

As noted above, in the cleaning step of the comparative example, a cleaning liquid is supplied to the surface and the rear face of the substrate W. This needs a large amount of the cleaning liquid. In contrast to this, in the embodiment, the cleaning liquid is supplied only to the rear face of the substrate W. This achieves a more reduced usage amount of cleaning liquid than that in the comparative example.

Figure 6:
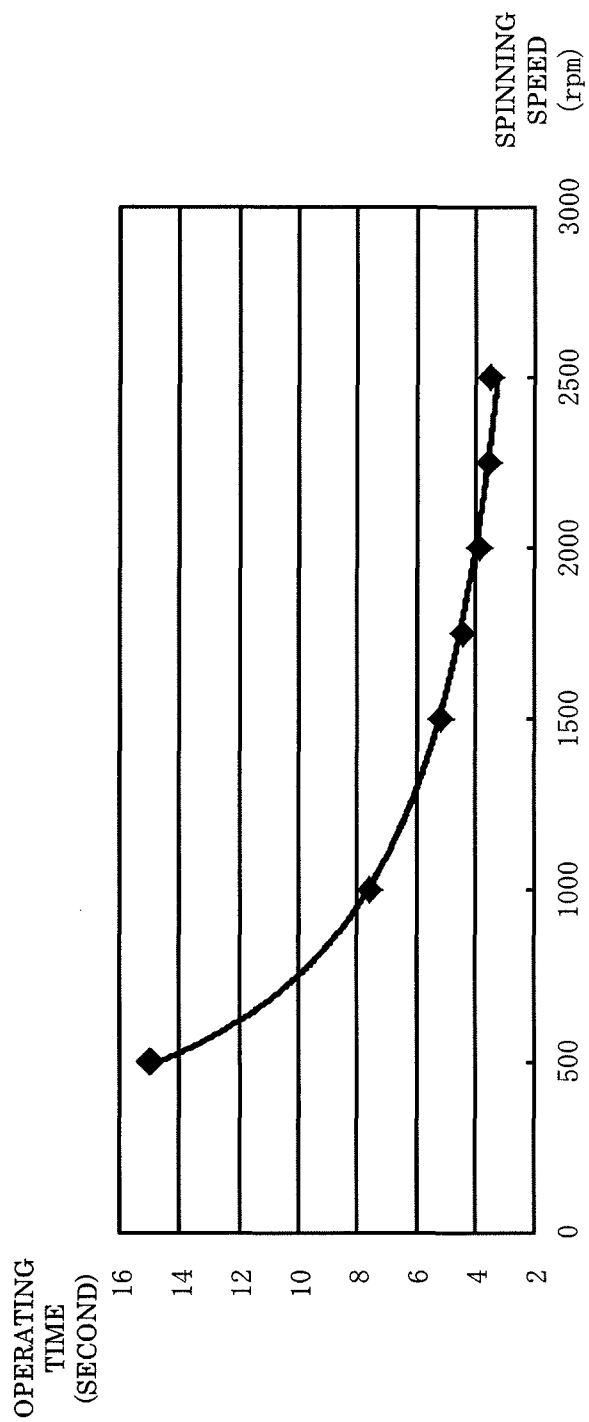
FIG. 6 is a graph illustrating a relationship between a spinning speed of a substrate and a time for drying a surface of the substrate.

Description will be given next of the first speed in the surface drying step. FIG. 6 is a graph illustrating a relationship between a spinning speed of the substrate and a time of drying the surface of the substrate.

As illustrated in FIG. 6, a drying time shortens as the spinning speed increases. Particularly, at a spinning speed in a range of 1500 rpm or less, a drying time sharply shortens as the spinning speed increases. On the other hand, at a spinning speed in a range of 1500 rpm or more, a drying time gradually shortens as the spinning speed increases. Accordingly, the drying time gradually approaches the minimum. As a result, a spinning speed of 1500 rpm to 2500 rpm can achieve a sufficiently reduced drying time of approximately four to five seconds. In other words, the first speed is preferably from 1500 rpm to 2500 rpm. In this case, the developer can be removed much rapidly. Consequently, the first speed in the range mentioned above allows highly accurate control of the line width in the circuit pattern.

This invention is not limited to the foregoing examples, but may be modified as follows.

(1) In the embodiment mentioned above, the developer supplying nozzle 11 and the cleaning liquid supply nozzle 13 are each straight nozzles. The nozzles, however, are not limited to this shape. That is, a slit nozzle having a slit outlet on a lower end thereof may be used.

(2) In the embodiment mentioned above, the developer is supplied to the substrate while the substrate is spun in Step S1. This is not limitative. For instance, the substrate may be spun at time t0 before the developer is supplied. Alternatively, the substrate may be spun at time t0 after the developer is supplied. In addition, the substrate does not need to be spun for a period from time t0 to time t1.

(3) In the embodiment mentioned above, the developer is supplied and thereafter spinning of the substrate W is stopped for a period from time t1 to time t2 to perform the developing step in Step S1. This is not limitative. That is, after the developer is supplied, the substrate W may be spun at an appropriate speed for a period from time t1 to time t2.

(4) In the embodiment mentioned above, the cleaning liquid supplying source 24 is individually disposed for supplying the cleaning liquid to the cleaning liquid supply nozzle 13. This is not limitative. Since the developer used for the negative development contains an organic solvent, the developer may be used as a cleaning liquid used for cleaning the rear face of the substrate W. In this case, the developer may also be used as the cleaning liquid.

Specifically, the cleaning liquid supplying pipe 23 is in fluid communication with the developer supplying source 16. Opening and closing of the switch control valves 21, 29 is controlled to switch a target portion to which the developer stored in the developer supplying source 16 is fed. That is, in the developer supplying step, the developer stored in the developer supplying source 16 is fed to the developer supplying nozzle 11, and the fed developer is used in the developing step. Thereafter, in the rear face cleaning step, the developer stored in the developer supplying source 16 is fed to the cleaning liquid supply nozzle 13, and the fed developer is used in the rear face cleaning step. The configuration mentioned above eliminates necessity to provide an individual cleaning liquid supplying source 24. Consequently, a simplified negative developing apparatus can be obtained.

The present invention may be embodied in other specific forms without departing from the spirit or essential attributes thereof and, accordingly, reference should be made to the appended claims, rather than to the foregoing specification, as indicating the scope of the invention.

What is claimed is:

1. A negative developing method comprising:
   a developing step of performing development by supplying a developer containing an organic solvent onto a resist film formed on a surface of a substrate and coating the resist film with the supplied developer;
   a surface drying step of spinning the substrate at a first speed without supplying a cleaning liquid, removing a dissolved product from the surface of the substrate together with the developer, and drying the surface of the substrate after the developing step, the dissolved product containing components of the resist film dissolved into the developer;

a rear face cleaning step of cleaning a rear face of the substrate by supplying a cleaning liquid only to the rear face of the substrate and spinning the substrate at a second speed lower than the first speed after the surface drying step; and a rear face drying step of drying the rear face of the substrate by spinning the substrate after the rear face cleaning step.

2. The negative developing according to claim 1, wherein the first speed is from 1500 rpm to 2500 rpm.

3. The negative developing according to claim 1, wherein in the rear face drying step, the rear face of the substrate is dried by spinning the substrate at a third speed higher than the second speed.

4. A negative developing method comprising:

a developing step of performing development by supplying a developer containing an organic solvent onto a resist film formed on a surface of a substrate and coating the resist film with the supplied developer; and a surface drying step of drying the surface of the substrate by spinning the substrate at a first speed without supplying a cleaning liquid, removing a dissolved product from the surface of the substrate together with the developer, and drying the surface of the substrate after the developing step, the dissolved product containing components of the resist film dissolved into the developer.

5. The negative developing according to claim 4, wherein the first speed is from 1500 rpm to 2500 rpm.

6. The negative developing according to claim 4, further comprising:

a rear face cleaning step of cleaning the rear face of the substrate by supplying the cleaning liquid only to the rear face of the substrate and spinning the substrate at the second speed lower than the first speed after the surface drying step.

7. A negative developing apparatus comprising:

a substrate holder configured to hold a substrate horizontally;

a substrate spinning section configured to spin the substrate held horizontally with the substrate holder;

a developer supplying section configured to supply a developer containing an organic solvent to a surface of the substrate held with the substrate holder;

a cleaning liquid supplying section configured to supply a cleaning liquid only to a rear face of the substrate; and a controller configured to control the substrate spinning section, the developer supplying section and the cleaning liquid supplying section so as to perform a developing step, a surface-drying step, a rear-face cleaning step and a rear-face drying step, the developing step development being performed by supplying the developer from the developer supplying section to the surface of the substrate to coat a resist film on the surface of the substrate with the developer; the surface drying step being performed by spinning the substrate at a first speed without supplying the cleaning liquid, removing a dissolved product from the surface of the substrate together with the developer, and drying the surface of the substrate, the dissolved product containing components of the resist film dissolved into the developer; the rear face cleaning step being performed by supplying the cleaning liquid from the cleaning liquid supplying section to the rear face of the substrate and spinning the substrate at a second speed lower than the first speed; and in the rear-face drying step, the rear face of the substrate being dried by spinning the substrate.

8. The negative developing according to claim 7, wherein the first speed is from 1500 rpm to 2500 rpm.

9. The negative developing according to claim 7, wherein the controller controls the substrate spinning section so as to dry the rear face of the substrate by spinning the substrate at a third speed higher than the second speed in the rear face drying step.

10. A negative developing apparatus comprising:

a substrate holder configured to hold a substrate horizontally;

a substrate spinning section configured to spin the substrate held horizontally with the substrate holder;

a developer supplying section configured to supply a developer containing an organic solvent to a surface of the substrate held with the substrate holder; and a controller configured to control the substrate spinning section and the developer supplying section so as to supply the developer from the developer supplying section and cover a resist film formed on the surface of the substrate with the developer to perform a developing step, and thereafter to dry the surface of the substrate while the developing step is stopped by spinning the substrate at a first speed without supplying the cleaning liquid, to remove the developer on the resist film with a centrifugal force, together with a dissolved product containing components of the resist film dissolved into the developer.

11. The negative developing according to claim 10, wherein the first speed is from 1500 rpm to 2500 rpm.

12. The negative developing apparatus according to claim 10, further comprising:

a cleaning liquid supplying section configured to supply a cleaning liquid only to a rear face of the substrate, wherein the controller controls the cleaning liquid supplying section so as to supply the cleaning liquid after the surface drying step and controls the substrate spinning section so as clean the rear face of the substrate by spinning the substrate at a second speed lower than the first speed.

* * * * *